United States Patent [19]

Huntington

[11] 4,066,919
[45] Jan. 3, 1978

[54] SAMPLE AND HOLD CIRCUIT

[75] Inventor: Robert Charles Huntington, Phoenix, Ariz.

[73] Assignee: Motorola, Inc., Schaumburg, Ill.

[21] Appl. No.: 672,682

[22] Filed: Apr. 1, 1976

[51] Int. Cl.² ............................................. G11C 27/02
[52] U.S. Cl. ................................. 307/353; 307/242; 328/151; 328/165
[58] Field of Search ............... 307/229, 230, 235 B, 307/235 C, 242; 328/150, 151, 162, 163, 165; 340/347 SH

[56] References Cited

U.S. PATENT DOCUMENTS

| 3,226,650 | 12/1965 | Higbie | 307/235 C |
| 3,820,033 | 6/1974 | Iwata | 307/235 C |

*Primary Examiner*—John Zazworsky
*Attorney, Agent, or Firm*—Joe E. Barbee

[57] ABSTRACT

An electronic circuit suitable to be fabricated in monolithic integrated circuit form for producing at an output terminal an output signal for a predetermined time period of which the value thereof corresponds to the value of a periodically sampled, time varying, input signal applied at an input terminal. The circuit comprises two identical and parallel channels connected between the input and the output terminals such that one channel is in a sample mode while the other channel is in a hold mode and vice versa. Each channel includes a pair of operational amplifiers operatively coupled to an integrating capacitor. The dual channel system provides self compensation for offset voltage and common mode rejection. Thus, no manual nulling adjustment is required. Because self compensation is renewed each sample/hold cycle, the circuit is substantially insensitive to temperature variations over a broad range of temperatures.

8 Claims, 10 Drawing Figures

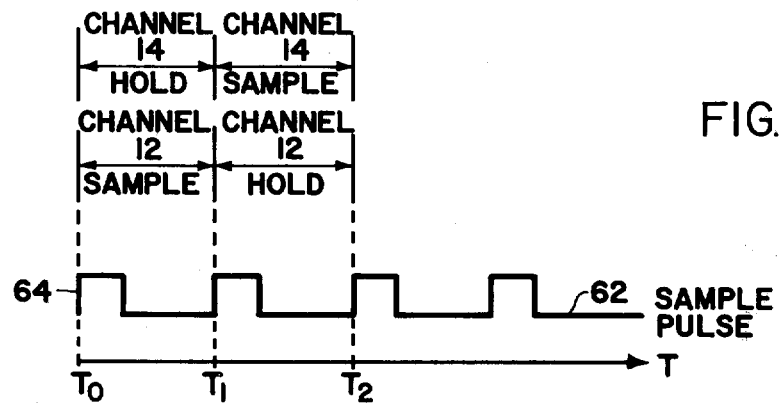
FIG. 4
TRUTH TABLE
X = SWITCH CLOSED
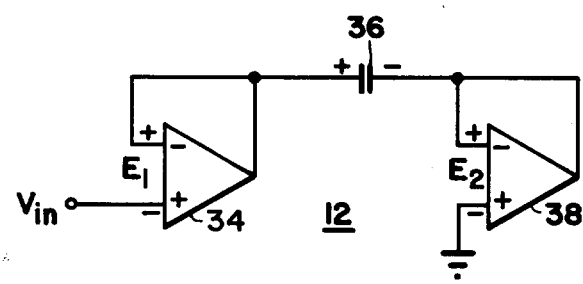
FIG. 5
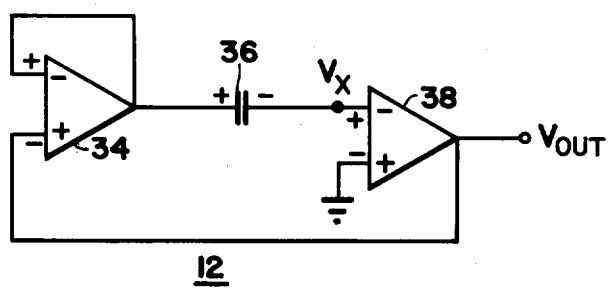
FIG. 6
FIG. 7

FIG. 8
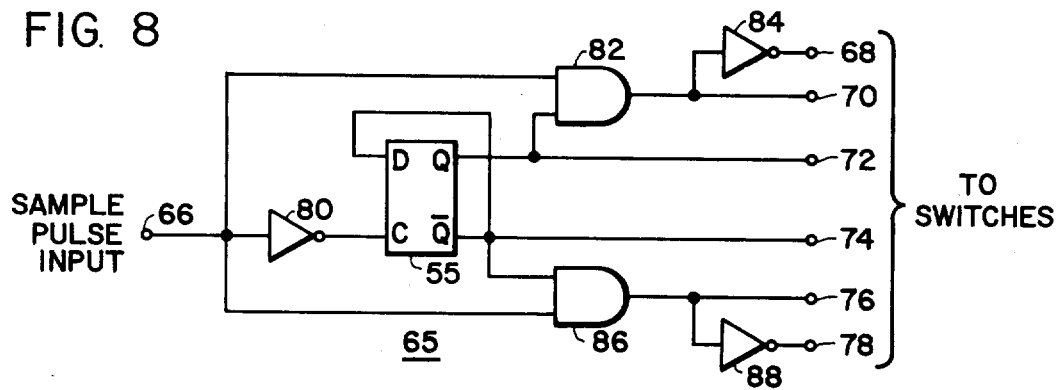
FIG. 9
| CYCLE | SWITCHES | | | | | | | |
|---|---|---|---|---|---|---|---|---|
| | 24 | 26 | 28 | 30 | 32 | 40 | 48 | 50 |
| *12-H(OUTPUT)<br>*14-H | | X | | | X | | X | |
| *12-H(OUTPUT)<br>*14-S | | X | X | | X | | | X |
| *12-H<br>*14-H(OUTPUT) | | | | X | X | | X | |
| *12-S<br>*14-H(OUTPUT) | X | | | X | | X | X | |
TRUTH TABLE  X=SWITCH CLOSED
FIG. 10
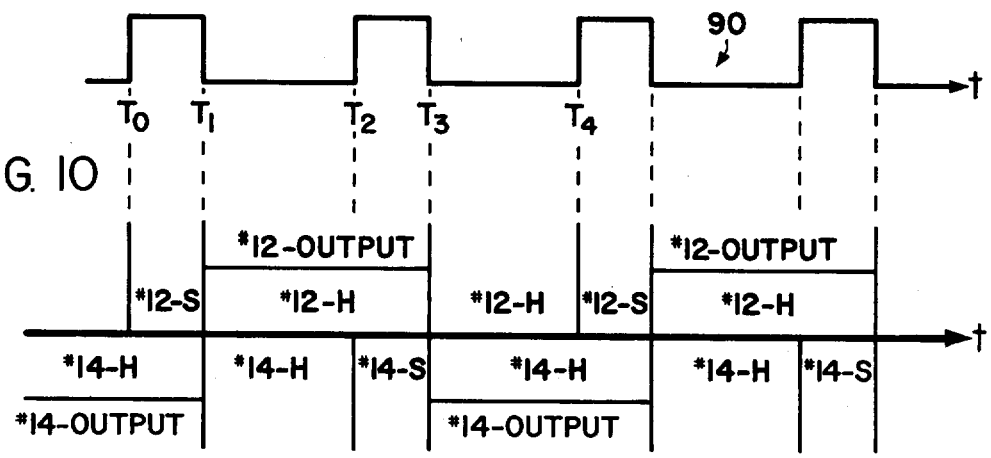

SAMPLE AND HOLD CIRCUIT

BACKGROUND OF THE INVENTION

The present invention relates to an electronic sample and hold circuit and more particularly to a sample and hold circuit suitable to be provided in monolithic integrated circuit form.

Many applications can be envisioned for sample and hold circuits. For example, one such application is as a peripheral unit for interfacing between a computer and a time varying analog signal. Another application may be as a means for sampling a time varying input signal to permit analog to digital conversion of the input signal at predetermined times. One further application may be as a means for sampling a signal which is to be coded for transmission and reception in a communication system.

Most contemporary sample and hold circuits are comprised of discrete circuitry. Thus the size of such circuits is relatively large with respect to monolithic integrated circuits which are produced and fabricated today.

Moreover, contemporary sample and hold circuits include passive components (resistors, capacitors), active switches and operational amplifiers which respond to externally generated sampling pulses to sample the time varying input signal for deriving an output signal the level of which corresponds to the magnitude of the input signal at the termination of the sampling pulse. However, a major problem associated with these types of sample and hold circuits is that they suffer from error signals which limit the accuracy of the output level produced. One such source of error arises from the DC offset voltage of the operational amplifiers which are most commonly used. Offset voltage is defined as the difference in dc input voltages required at the input terminals of the operational amplifier to produce a zero output voltage therefrom. In order to compensate for offset voltages, prior art sample and hold circuits require an offset nulling potentiometer as part of the circuit. However, even though the offset voltage may be nulled at one particular input signal level, operation at a different input signal level may introduce an error in the output signal due to imperfect common mode rejection ratio in the operational amplifier. In addition, the thermal dependence of the offset voltage makes it quite difficult to compensate therefor over temperature variations. As the environmental operating temperature varies, manual adjustment of the nulling adjustment must be made to maintain circuit accuracy. As an example, commercially available sample and hold circuits typically have temperature coefficients in the range of 10 ppm/° C to 100 ppm/° C. Thus, as temperature varies, to maintain accuracies, the prior art circuit must be nulled continuously.

Further, the precision with which sampling is effected in the prior art circuits is also a function of the common mode rejection ratio (CMRR) factor of the operational amplifiers. The nulling adjustment common to most sample and hold circuits is used for adjustment of offset voltages, a direct current (dc) parameter. However, as the input signal is normally a time varying function, as the magnitude of the input voltage varies so does the offset voltage of the operational amplifier. Thus, even though accuracy adjustments can be made to the prior art circuits for a desired input signal level, error is still introduced during sampling because of CMRR.

One further problem associated with prior art sample and hold circuits is that the sampling pulse rate is limited by the slew rate of the operational amplifiers comprising the circuit. Thus the prior art circuits are slew rate limited on acquisition time.

Thus, a need exists for an improved sample and hold circuit having self compensation for output offset voltage and common mode rejection in order that a manual accuracy adjustment is not required. By elimination of these errors, a sample and hold circuit having essentially zero temperature coefficient may be produced. A further need exists for a sample and hold circuit which is not slew rate limited.

SUMMARY OF THE INVENTION

Accordingly, it is an object of the present invention to provide an improved sample and hold circuit.

It is another object of the present invention to provide a sample and hold circuit suitable to be fabricated in monolithic integrated circuit form.

It is a further object of the present invention to provide a sample and hold circuit having self compensation for offset voltage and common mode rejection thereby eliminating manual accuracy adjustment requirements.

The foregoing and other objects are achieved in accordance with the present invention by providing a sample and hold circuit suitable for producing at an output terminal, an output signal for a predetermined time period the magnitude of which corresponds to the magnitude of a periodically sampled time variable input signal, at an instant determined by a command signal, prior to the predetermined time period. The sample and hold circuit includes first and second circuits coupled in a parallel configuration between the input and output terminals of the sample and hold circuit. The first circuit is responsive to a first control signal for sampling the input signal and is responsive to a second control signal for producing said sampled signal at the output terminal while the input thereof is isolated from the input terminal of the circuit. The second circuit is responsive to the first control signal for producing a sampled signal at the output terminal of the circuit while the input thereof is isolated from the input terminal of the circuit and is also responsive to the second control signal for sampling the variable input signal during the duration thereof while its output is isolated from the output terminal of the sample and hold circuit.

BRIEF DESCRIPTION OF THE DRAWINGS

FIG. 4 is a truth table for the sample and hold circuit of FIG. 2;

FIG. 5 is a timing diagram showing wave forms which illustrate the operation of the sample and hold circuit of FIG. 2;

FIG. 6 illustrates the circuit configuration of a portion of the sample and hold circuit of FIG. 2 during a sample mode;

FIG. 7 illustrates the circuit configuration of a portion of the circuit of FIG. 2 during a hold mode;

FIG. 8 illustrates a logic driver circuit for controlling the operation of the sample and hold circuit of FIG. 2 of another embodiment of the invention;

FIG. 9 is a truth table for the sample and hold circuit of FIG. 2 which is controlled by the logic driver circuit of FIG. 8;

FIG. 10 is a timing diagram showing wave forms which illustrate the operation of the sample and hold circuit of FIG. 2 which is driven by the logic driver circuit of FIG. 8.

DETAILED DESCRIPTION OF THE PREFERRED EMBODIMENTS

Figure 1:
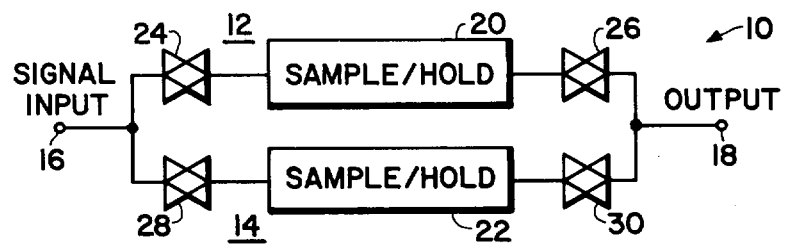
FIG. 1 is a block diagram of a sample and hold circuit of the present invention.

Referring to the Figures, there is shown a unique, self-correcting sample and hold circuit 10 which is suitable to be fabricated in monolithic integrated circuit form. Sample and hold circuit 10 provides for sampling a time varying input signal at a time determined by an extrenally generated control or sample pulse and holds that value constant until upon command another sample of the time varying input signal is taken. Sample and hold circuit 10 is illustrated as including dual channels 12 and 14, respectively, which are connected between input terminal 16 to which an input time varying signal is applied, and an output terminal 18 at which the output is derived. Dual channels 12 and 14 which include sample and hold channels 20 and 22 are coupled to the input and output terminals by analog switches 24, 26, and 28, 30, respectively.

Briefly, in response to a sampling pulse being applied to the analog switches, for example, channel 12 will be in a sample mode and rendered responsive to sample the input signal applied at terminal 16. Simultaneously Channel 14 is isolated from the input and is in a hold mode with the output therefrom being applied to output terminal 18. In the next mode of operation, channel 12 is isolated from input terminal 16 and is connected to output terminal 18 for applying the sampled signal at the output thereof while channel 14 is in a sample mode and is connected to input terminal 16 but isolated from output terminal 18.

Figure 2:
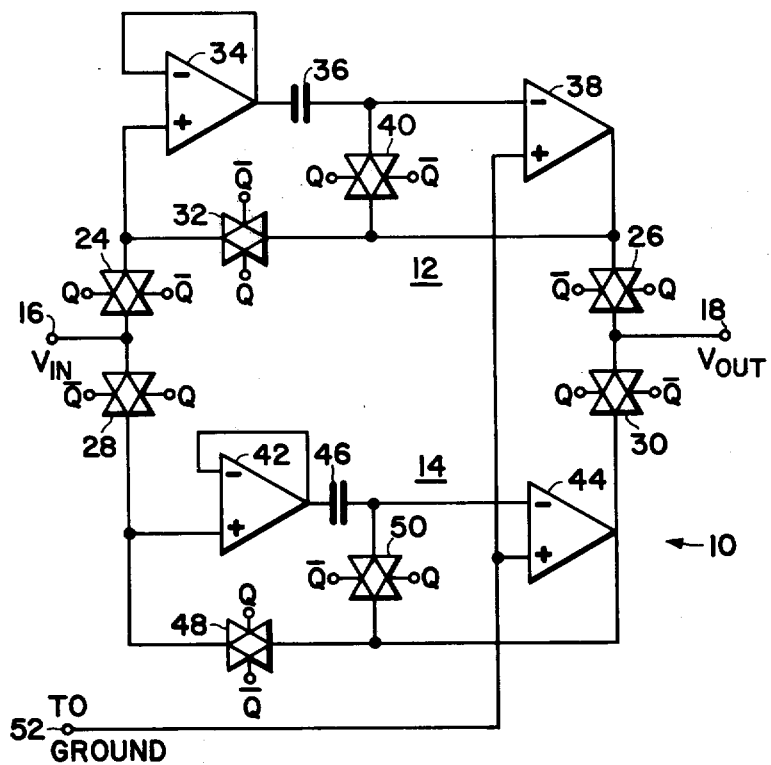
FIG. 2 is a more detailed partial schematic and block diagram of the sample and hold circuit of the invention.
Figure 3:
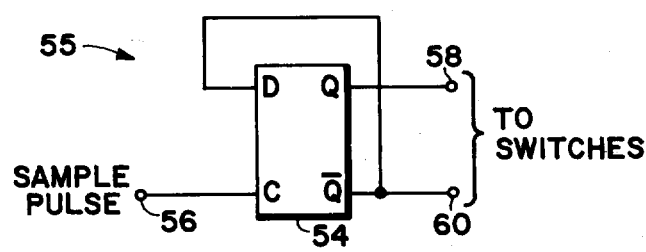
FIG. 3 illustrates a logic driver circuit for controlling the operation of the embodiment of FIG. 2.

Referring now to FIGS. 2 and 3, there is shown in more detailed form, sample and hold circuit 10 illustrated in FIG. 1. It is understood that the same reference numbers are used for components which correspond to like components of FIG. 1. Each of the channels 12 and 14, of sample and hold circuit 10, is illustrated as comprising two operational amplifiers, four transmission gates, and an integrating capacitor. It should be understood that the term transmission gate and analog switch may be used interchangeably. In a preferred embodiment, the transmission gates and operational amplifiers of each of the channels of sample and hold circuit 10 are fabricated using monolithic integrated circuit techniques.

Channel 12 is shown as including transmission gate 24 of which an input electrode is thereof coupled to input terminal 16 and an output terminal connected to the input electrode of transmission gate 32 and to the noninverting terminal of operational amplifier 34. Operational amplifier 34 is connected in a voltage follower configuration, as is understood, and also has the output thereof connected to capacitor 36 of which the other terminal is coupled to the inverting input terminal of operational amplifier 38. The output electrode of transmission gate 32 is coupled to the output of operational amplifier 38 and to the input electrode of transmission gate 40. The output electrode of transmission gate 40 is connected to the inverting terminal of operational amplifier 38 and to capacitor 36. The output of operational amplifier 38 is also coupled through transmission gate 26 to output terminal 18 of sample and hold circuit 10. As may be seen, channel 14 of dual channel sample and hold circuit 10 is identical to channel 12 thereof and includes operational amplifier 42 and 44, integrating capacitor 46, and transmission gates 28, 30, 48 and 50 respectively. The noninverting input terminals of operational amplifiers 38 and 44 are both connected to the ground reference potential at terminal 52.

It is to be understood that the above disclosed transmission gates may be of any form known in the art such as the MOSFET transmission gates disclosed in U.S. Pat. No. 3,930,169 issued to Harry A. Kuhn, Jr., assigned to the same assignee as here.

FIG. 3 illustrates a simple logic circuit 55 which may be fabricated in monolithic integrated circuit form and which is compatible with sample and hold circuit 10. Logic circuit 55 controls the switching of the transmission gates of sample and hold circuit 10. Logic circuit 55 comprises a well-known D type flip-flop 54 connected in a toggle configuration which is adapted to receive sampling pulses, at a predetermined sampling rate, at input terminal 56 and derives control signals at output terminals 58 and 60 which are coupled to respective control terminals of the transmission gates or switches of FIG. 2.

Referring to FIGS. 4 through 7 the operation of the sample and hold circuit 10 of FIG. 2 is now explained in greater detail. The truth table of FIG. 4 illustrates the closure of the transmission gates of the circuit of FIG. 2 to operate sample and hold circuit 10 in a manner which will be described. Channel 12 is in a sample mode when transmission switches 24 and 40 are in a conducting state. Simultaneously, channel 14 is in a hold mode when transmission gates 30 and 48 are in a conducting state. However, when it is desired to switch states such that channel 12 is in a hold mode, transmission gates 24 and 40 are rendered nonconductive and transmission gates 32 and 26 are rendered conductive. Likewise, with channel 12 in a hold mode, channel 14 will be in a sample mode such that transmission gates 28 and 50 are rendered conductive while at the same time gates 30 and 48 are rendered nonconductive. To provide the function of rendering respective transmission gates of dual channel sample and hold circuit 10 either conductive or nonconductive, the Q output (terminal 58) of D flip-flop 55 is coupled respectively to the Q control terminals of transmission gates 24, 30, 40, 48, and to the $\overline{Q}$ control terminals of transmission gates 26, 28, 32, and 50. In a like manner, output terminal 60 (the $\overline{Q}$ output) of D type flip-flop 55 is connected to the complementary control terminals of the foregoing transmission gates.

Referring to FIG. 5 there is shown a wave form that is useful for illustrating the operation of the embodiment of FIG. 2. Sampling pulses are applied to input 56 of flip-flop 55 at a predetermined sampling rate for which $(T_0-T_1)$ is one period as shown by wave form 62. For example, if flip-flop 55 is constructed to change states with the leading edge of the positive going pulse (wave form portion 64) then a positive output signal will appear at output terminal 58 with its complement at terminal 60. The output control signals at output terminals 58 and 60 of D flip-flop 55 will remain in the aforedescribed states between time $T_0$ and $T_1$. In this state, transmission gates 24, 30, 40 and 48 are rendered conductive with transmission gates 26, 28, 32 and 50 being rendered nonconductive such that, as illustrated in FIG. 5, channel 12 is in a sample mode and channel 14 is in a hold mode. Thus during time period $T_0-T_1$ the input, time varying signal applied at terminal 16 is continously sampled by channel 12 while channel 14 produces at the output terminal 18 a signal value which existed at the end of the preceding sample cycle. This state continues until the arrival of another sample pulse, at time $T_1$, which causes the output states of flip-flop 55 to reverse. At this time, transmission gates 26, 28, 32 and 50 are rendered conductive and gates 24, 30, 40, and 48 are rendered nonconductive such that channel 12 is placed in a hold mode and channel 14 is placed in a sample mode. (Although it is shown that the states of the dual channels are changed on the leading edge of the sample pulse it is to be understood that suitable logic circuit design can cause the states to be changed on a trailing edge of the sampling pulse 62.)

Dual channel sample and hold circuit 10 provides several significant advantages over prior art sample and hold circuits which include operational amplifiers. The use of a dual channel system provides a method of self-compensating the sample and hold circuit for effects of operational amplifier offset voltage and common mode rejection. The dual system configuration allows an output voltage to be maintained at all times while compensating voltages for the operational amplifier offset voltages are being derived and the input signal is being sampled periodically. Furthermore, the dual channel system allows the slewing rate at the output terminal thereof to be independent of the slew rate of each individual operational amplifier. That is, in normal operation the operational amplifier has already slewed and acquired the input signal before it is connected to the output terminal.

Referring to FIGS. 6 and 7, channel 12 of sample and hold circuit 10 is illustrated as being, respectively, in a sample and hold mode configuration. Although the following description is in regards to channel 12, it is to be understood that channel 14 operates in the same manner. As will be explained hereinafter, the particular configuration of each individual channel, between a sample and hold mode, provides for overcoming offset voltage errors and common mode rejection errors associated with operational amplifiers which have not been overcome by the prior art. It will be shown that each individual sample and hold channel of sample and hold circuit 10 is independent of error offset voltages such that a manual accuracy adjustment is not required by the embodiment of the present invention.

Referring to FIG. 6, it is assumed that channel 12 of sample and hold circuit 10 is in a sample mode (transmission gates 24, 40 are rendered conductive and gates 32, 26 nonconductive. In the sample mode, operational amplifiers 34 and 36 are in a voltage follower configuration (the output of the operational amplifier being connected to the inverting input terminal). Thus, a voltage, E, can be defined which is equal to:

$$E = \frac{A}{A+1} E_{OS} = E_{OS} \qquad (1)$$

where:
A = amplifier open loop gain
$E_{OS}$ = amplifier offset voltage

Thus, if A is equal to 10,000 or greater, then from equation (1), E is equal to $E_{OS}$. Thus $E_1$ and $E_2$ are equal to the offset voltage of respective amplifiers 34 and 38.

In the sample mode configuration (FIG. 6), the voltage across capacitor 36, V, equals:

$$V = V_{IN} + E_1 - E_2 \qquad (2)$$

Amplifier 34 also buffers the input signal to provide the charging current to capacitor 36 during the sample.

Next, as illustrated by FIG. 7, channel 12 is shown in a hold mode. In this configuration, charged capacitor 36, and voltage follower amplifier 34 are placed in series in the feedback loop of amplifier 38.

From the circuit configuration:

$$V_{OUT} = A_{38}(V_X - E_2) \qquad (3)$$

and, $$V_X = \frac{V_{OUT}}{A_{38}} + E_2 \qquad (4)$$

with $$V_X = V_{OUT} + E_1 - V \qquad (5)$$

by rearranging equations 3, 4, 5

$$V_{OUT} = \frac{A_{38}}{A_{38} - 1} [E_2 - E_1 + V] \qquad (6)$$

Finally, substituting equation (2) into equation (6) yields:

$$V_{OUT} = \frac{A_{38}}{A_{38} - 1} [E_2 - E_1 + V_{IN} + E_1 - E_2] \qquad (7)$$

Thus $$V_{OUT} = \frac{A_{38}}{A_{38} - 1} V_{IN} = V_{IN} \quad \text{where } A_{38} >> 1 \qquad (8)$$

where $A_{38} >> 1$

It has been shown above that the output voltage of the sample and hold circuit is essentially equal to the periodically sampled input voltage. Moreover, as determined by equations 1-8, the offset voltages for respective amplifiers 34 and 38 are cancelled. Thus, sample and hold circuit 10 tracks the time varying input signal applied thereto, and then holds the instantaneous input value of the input signal upon command. Furthermore, the sample and hold circuit comprises dual channels wherein, in response to the logic control signal, one channel is caused to sample the input time varying signal while the other channel is in a hold mode and vice versa. The dual channel system provides an advantage over the prior art in that cancellation of offset voltage errors associated with operational amplifiers has eliminated a need for an accuracy adjustment circuit.

Moreover, inspection of the circuit configurations of FIGS. 6 and 7 shows that the voltage levels applied to respective inputs of operational amplifiers 34 and 38 do not change when progressing from the sample mode to the hold mode. As a result, common mode rejection ratios in both operational amplifiers are eliminated as factors in determining the sample and hold circuit accuracy.

In some circuit applications it is desirable that the sample and hold circuits sample the time varying signal only during the time period that is defined by the duration of the sample pulse (instead of full duration of the second channel hold cycle as has been described above). By a simple change in the switch control logic circuit, the aforedescribed sample and hold circuit readily provides such operation. Referring to the remaining Figures, there is shown in FIG. 8 a logic command circuit which, in response to a sample pulse applied to input terminal 66, produces the appropriate control signals at output terminals 68 through 78 respectively. In this configuration, flip-flop 55 has inverter 80 placed between its input terminal and the applied sample pulse. The Q output of flip-flop 55 is connected to one input terminal of AND gate 82 with the other input terminal thereof adapted to be connected to sample input pulse terminal 66. The output of AND gate 82 is then adapted to be connected directly to terminal 70 and to output terminal 68 through inverter 84. The Q output of flip-flop 55 is also applied to terminal 72. The complementary output signal ($\overline{Q}$) of flip-flop 55 is directly coupled to output terminal 74 and to one input terminal of AND gate 86. The other input terminal to AND gate 86 is coupled to the sample pulse input terminal 66 with the output thereof being directly coupled to terminal 76 and via inverter 88 to output terminal 78. In a like manner as explained for the logic control drive of FIG. 3, output terminal 68 is coupled to transmission switch or gate 32, output terminal 70 to transmission gates 24, 40, terminal 72 to transmission gate 30, output terminal 74 to gate 26, output terminal 76 to transmission gates 28 and 50, and output terminal 78 to transmission gate 48.

Referring to FIGS. 9 and 10, the operation of the sample and hold circuit 10 which is driven by logic control circuit 65, can be explained. In this configuration, at time $T_O$, in response to the leading positive edge of sample pulse 90, transmission gates 24, 40, 48 and 30 are rendered conductive with the other gates remaining nonconductive. Thus channel 12 is in a sample mode and channel 14 in a hold mode. With channel 14 in the hold mode and with transmission gate 30 being rendered conductive, the output of channel 14 is applied to output terminal 18. In response to the negative going trailing edge of sample pulse 90, time $T_1$, the output from logic control 65 is changed such that only transmission gates 32, 26, and 48 are rendered conductive with all the other transmission gates being rendered nonconductive. In this configuration, channel 12 is in a hold mode and produces an output at output terminal 18 of sample and hold circuit 10. Simultaneously, channel 14 remains in a hold mode, however, the output therefrom is isolated from output terminal 18 by transmission gate 30 being rendered nonconductive. At time $T_2$, the output states of logic control driver 65 again change in response to the positive going leading edge of the next sample pulse such that transmission gates 32, 26, 28, and 50 are rendered conductive with all other gates remaining nonconductive. At this time, channel 12 remains in a hold mode with the output therefrom applied to output terminal 18 of sample and hold circuit 10 while channel 14 is placed in a sample mode for sampling the time varying input signal applied to terminal 16. This configuration is maintained until time $T_3$. At time $T_3$, channel 12 remains in a hold mode, however, the output therefrom is isolated from output terminal 18. Simultaneously, channel 14 is placed in a hold mode with the output thereof being applied to output terminal 18 of sample and hold circuit 10. The aforedescribed states remain until time $T_4$, at which in response to the next sample pulse, channel 12 switches from a hold configuration to a sample mode configuration and channel 14 remains in the hold mode with the output thereof still applied to output terminal 18. The cycle of operation has been completed and sample and hold circuit is in the same condition as at time $T_0$. Therefore, because of the above described operation, the input time varying signal is sampled only during the time duration of the sample pulse and the sampled signal level is presented as the output signal immediately after sampling. However, by using the dual channel system, once again the errors associated with prior art operational amplifier sample and hold circuits are eliminated as has been previously described.

Thus, what has been described is an improved sample and hold circuit to be provided in monolithic integrated circuit form. The sample and hold circuit of the embodiment of the invention is entirely self-compensating for offset voltage and common mode rejection errors normally associated with operational amplifier sample and hold circuits. This compensation is updated for every sample and hold cycle. For this reason, no manual adjustments (such as offset nulling) are required. Moreover, because the offset voltage and common mode rejection compensation is renewed for each sample and hold cycle of operation, the sample and hold circuit of the invention is substantially independent to temperature variations over a broad temperature range.

Furthermore, the sample and hold circuit of the present invention is not slew rate limited on acquisition time. In addition, the sample and hold circuit which has been described is suitable to be manufactured using known MOS circuit technology. This technology provides the added advantage of requiring less power which reduces the power drain of the sample and hold circuit. The sample and hold circuit of the invention provides a high input impedance ($>10^9$ ohms) to the input signals being sampled by including buffer amplifiers. This prevents loading of the input siganl during sampling thereof.

What is claimed is:

1. A circuit for tracking magnitude of a time varying input signal and for producing upon command an output signal for a predetermined time having a magnitude which corresponds to an instantaneous value of the magnitude of the time varying input signal at the time of command, the circuit having at least an input terminal and an output terminal, comprising: means for supplying control signals; a first amplifier connected as a voltage follower and having an input and an output; first switching means responsive to the control signals, the first switching means being coupled from the input terminal to the input of the first amplifier; a second amplifier having an output, an inverting and a noninverting input; first means for storing a voltage and being coupled from the output of the first amplifier to the inverting input of the second amplifier; second switching means responsive to the control signals and being coupled from the inverting input of the second amplifier to the output of the second amplifier; third switching means responsive to the control signals and being coupled from the input of the first amplifier to the output of the second amplifier; fourth switching means responsive to the control signals and being coupled from the output of the second amplifier to the output terminal of the circuit, a third amplifier connected as a voltage follower and having an input and an output;

fifth switching means responsive to the control signals, the fifth switching means being coupled from the input terminal of the circuit to the input of the third amplifier; a fourth amplifier having an output, an inverting, and a non-inverting input; second means for storing a voltage and being coupled from the output of the third amplifier to the inverting input of the fourth amplifier; sixth switching means responsive to the control signals and being coupled from the inverting input of the fourth amplifier to the output of the fourth amplifier; seventh switching means responsive to the control signals and being coupled from the input of the third amplifier to the output of the fourth amplifier; and eight switching means responsive to the control signal and being coupled from the output of the fourth amplifier to the output terminal of the circuit, the means for supplying control signals controlling all the switching means to allow the first amplifier to be switched to the input terminal and simultaneously switching the fourth amplifier to the output terminal and then to allow the second amplifier to be switched to the output terminal while simultaneously switching the third amplifier to the input terminal so that as the amplifiers are switched to the input terminal an input signal can be sampled and self compensation for offset voltage and common mode rejection is provided thereby eliminating manual accuracy adjustment requirements.

2. A sample and hold circuit for tracking magnitude of a time varying input signal and for producing upon command an output signal for a predetermined time having a magnitude which corresponds to instantaneous value of the magnitude of the time varying input signal at the time of command, the sample and hold circuit having an input and an output, comprising: means for supplying control signals upon command; first circuit means selectively coupled between the input and the output of the sample and hold circuit for tracking the magnitude of the time varying input siganl and then selectively providing the instantaneous value of the magnitude thereof at the output of the sample and hold circuit in response to said control means; and second circuit means coupled between the input and output of the circuit for tracking the magnitude of the time varying input signal and then providing the instantaneous magnitude thereof at the output of the sample and hold circuit in response to said control signals, said second circuit means tracking the input siganl while said first circuit means is providing the instantaneous value thereof and said second circuit means providing the instantaneous value of the input signal while said first circuit means is tracking the same, said first circuit means includes first charge storage means, first input switch means connected to the input terminal of the sample and hold circuit, said first input switch means being alternately rendered conductive and nonconductive in response to said control signals, first input buffer means coupled between said first input switch means and said first charge storage means for charging the same when said first input switch means is rendered conductive, first output switch means connected to the output terminal of the sample and hold circuit, said first output switch means being rendered alternately nonconductive and conductive in response to said control signals, first output buffer means coupled between said first charge storage means and said first output switch means for providing an instantaneous magnitude of the time varying input signal at the output terminal of the sample and hold circuit when said first output switch means is rendered conductive; said second circuit means includes second charge storage means, second input switch means connected to the input terminal of the sample and hold circuit, said second input switch means being alternately rendered conductive and nonconductive in response to said control signals, second input buffer means coupled between said second input switch means and said second charge storage means for charging the same to a value representative of the instantaneous magnitude of the input signal when said second input switch is rendered conductive, second output switch means connected to the output terminal of the sample and hold circuit, said second output switch means being rendered alternately nonconductive and conductive in response to said control signals, and second output buffer means coupled between said second charge storage means and said second output switch means for providing said instantaneous magnitude of the time varying input signal at the output terminal of the sample and hold circuit when said second output switch is rendered conductive.

3. The circuit of claim 2 wherein said first input buffer means includes:
- a first operational amplifier having at least a non-inverting input and an output, said first operational amplifier being connected in a voltage follower configuration with the non-inverting input thereof coupled to said first input switch means, the output thereof being coupled to said charge storage means; and
- first switch means coupled to said first charge storage means and being in parallel with said first output buffer means, said first switch means being rendered conductive concurrently with said input switch means.

4. The circuit of claim 3 wherein said first output buffer means includes:
- a second operational amplifier having inverting and noninverting input terminals and an output terminal, said output terminal being connected to said first output switch means and said first switch means, said noninverting input terminal being connected to a ground reference potential, and said inverting input terminal being coupled to said said first switch means and to said first charge storage means; and
- second switch means coupled between said first input switch means and said output terminal of said first operational amplifier.

5. The circuit of claim 2 wherein said second input buffer means includes:
- a third operational amplifier having at least a non-inverting input and an output, said first operational amplifier connected in a voltage follower configuration with the non-inverting input thereof coupled to said second input switch means, the output thereof being coupled to said second charge storage means; and
- third switch means coupled to said second charge storage means and being in parallel with said second output buffer means.

6. The circuit of claim 5 wherein said second output buffer means includes:
- a fourth operational amplifier having inverting and noninverting input terminals and an output terminal, said output terminal being connected to said second output switch means and said third switch means, said noninverting input terminal being connected to said ground reference potential, and said inverting input terminal being coupled to said said third switch means and to said charge storage means; and fourth switch means coupled between said second input switch means and said output terminal of said fourth operational amplifier.

7. The circuit of claim 6 wherein said means for supplying control signals includes:

a logic control driver circuit having input and first and second output terminals, said input terminal being adapted to receive command signals and said first and second outputs being coupled to said first circuit means for selectively rendering said first and second input switch means, said first and second output switch means, and said first, second, third, and fourth switch means conductive and nonconductive in response to said command siganls; and said first and second and third and fourth operational amplifiers of said first and second circuit means providing compensation for offset voltage errors associated therewith.

8. A monolithic integrated circuit sample and hold circuit for periodically sampling an input signal applied thereto in response to a periodic sampling pulse and for sequentially providing and maintaining an output signal for a predetermined time with magnitude of the output signal being representative of the sampled input signal, comprising: means for providing periodic control signals in response to the sampling pulse; first channel means responsive to said periodic control signals for selectively sampling the input signal during a predetermined time interval and then selectively providing the output signal in response to said periodic control signal; and second channel means coupled in parallel to said first channel means and being responsive to said periodic control signals for selectively sampling the input signal during another predetermined time interval and then selectively providing the output signal in response to said periodic control signals; said first channel means including charge storage means having first and second terminals, first amplifier means having an output connected to said first terminal of said charge storage means for charging the same in response to the input signal being applied to an input thereof, first gate means responsive to said control signals for coupling the input signal to the input of said first amplifier means when the input signal is being sampled, and being responsive to said control signals for isolating said first amplifier means from the input signal when said first channel means is providing the output signal, second amplifier means having first and second inputs and an output for providing the control signal at an output of the sample and hold circuit, said first input of said second amplifier means being connected to said second terminal of said charge storage means, said second input being connected to a ground reference, second gate means responsive to said control signals for coupling the output signal from said second amplifier means when said first channel means is providing the output signal and being responsive to said control signals for isolating the output of said second amplifier means from the output when said first channel means is sampling the input signal, third gate means coupled between said second terminal of said charge storage means and said output of said second amplifier means, said third gate means being alternatively rendered conductive and nonconductive in response to said control signals when said first channel means is sampling and providing an output signal, respectively, and fourth gate means coupled between said first gate means and said output of said second amplifier means, said fourth gate means being alternately rendered nonconductive and conductive when said first channel means is sampling and providing the output signal, respectively; and said second channel means including another charge storage means having first and second terminals, third amplifier means having an output connected to said first terminal of said another charge storage means for charging the same in response to the input signal being applied to an input thereof, fifth gate means responsive to said control signals for coupling the input signal to said input of said first amplifier means when the input signal is being sampled, and being responsive to said control signals for isolating said first amplifier means from the input signal when said second channel means is providing the output signal, fourth amplifier means having first and second inputs and an output for providing the output signal at said output, said first input of said fourth amplifier means being connected to said second terminal of said another charge storage means, said second input being connected to a ground reference, sixth gate means responsive to said control signals for coupling the output signal from said second amplifier means when said second channel means is providing the output signal and being responsive to said control signals for isolating the output of said second amplifier means from the output when second channel means is sampling the input signal, seventh gate means coupled between said second terminal of said another charge storage means and said output of said second amplifier means, said third gate means being alternatively rendered conductive and nonconductive in response to said control signals when said second channel means is sampling and providing an output signal, respectively, and eighth gate means coupled between said first gate means and said output of said second amplifier means, said fourth gate means being alternatively rendered nonconductive and conductive when said second channel means is sampling and providing the output signal, respectively.

* * * * *